United States Patent
Bright et al.

(10) Patent No.: US 11,880,498 B2
(45) Date of Patent: Jan. 23, 2024

(54) DEFORMABLE HUMAN INTERFACE DEVICE

(71) Applicant: Liquid Wire Inc., Portland, OR (US)

(72) Inventors: Sydney Steinmeyer Bright, Portland, OR (US); Andrew Elliott, Portland, OR (US)

(73) Assignee: Liquid Wire Inc., Portland, OR (US)

(*) Notice: Subject to any disclaimer, the term of this patent is extended or adjusted under 35 U.S.C. 154(b) by 175 days.

(21) Appl. No.: 17/645,621

(22) Filed: Dec. 22, 2021

(65) Prior Publication Data
US 2022/0283629 A1    Sep. 8, 2022

Related U.S. Application Data

(63) Continuation of application No. 16/833,508, filed on Mar. 27, 2020, now abandoned.

(60) Provisional application No. 62/824,457, filed on Mar. 27, 2019.

(51) Int. Cl.
*G06F 3/01*    (2006.01)
*G06F 3/02*    (2006.01)

(52) U.S. Cl.
CPC ............ *G06F 3/011* (2013.01); *G06F 3/0202* (2013.01)

(58) Field of Classification Search
CPC ......... G06F 3/011; G06F 3/0202; G06F 3/033
USPC .......................................................... 341/34
See application file for complete search history.

(56) References Cited

U.S. PATENT DOCUMENTS

| | | | | |
|---|---|---|---|---|
| 6,747,579 | B1* | 6/2004 | Ireland | H03K 17/9625 200/341 |
| 6,980,136 | B2* | 12/2005 | Tsai | H03M 11/10 341/27 |
| 8,711,011 | B2* | 4/2014 | Casparian | G06F 3/0202 341/20 |
| 8,784,303 | B2 | 7/2014 | Laby et al. | |
| 8,922,399 | B2* | 12/2014 | Bajaj | G06F 3/016 702/41 |
| 2004/0046739 | A1 | 3/2004 | Gettemy | |
| 2008/0068229 | A1* | 3/2008 | Chuang | G06F 3/045 341/34 |
| 2009/0189749 | A1 | 7/2009 | Salada | |

(Continued)

OTHER PUBLICATIONS

"U.S. Appl. No. 16/833,508, Advisory Action dated Nov. 16, 2021", 3 pgs.

(Continued)

*Primary Examiner* — Albert K Wong
(74) *Attorney, Agent, or Firm* — Schwegman Lundberg & Woessoer, P.A.

(57) ABSTRACT

A human interface device may include a deformable body having a handle portion, and a deformable conductor coupled to the deformable body and arranged to deform in response to a physical manipulation of the deformable body. The physical manipulation may include compressing, flexing, twisting, and/or stretching at least a portion of the deformable body. The deformable conductor may be arranged to change an electric characteristic such as a resistance, capacitance and/or inductance in response to the physical manipulation. The deformable conductor may include a sensor portion, and a transmission portion. The sensor portion may sense a first type of physical manipulation, and the transmission portion may sense a second type of physical manipulation.

20 Claims, 7 Drawing Sheets

(56) References Cited

U.S. PATENT DOCUMENTS

| | | | |
|---|---|---|---|
| 2010/0321301 A1* | 12/2010 | Casparian | G06F 3/0202 |
| | | | 345/168 |
| 2013/0201093 A1 | 8/2013 | Kim et al. | |
| 2013/0300590 A1* | 11/2013 | Dietz | G06F 11/3051 |
| | | | 341/34 |
| 2014/0029017 A1 | 1/2014 | Lee et al. | |
| 2015/0227216 A1 | 8/2015 | Fukumoto | |
| 2016/0085315 A1* | 3/2016 | Casparian | H03K 17/975 |
| | | | 361/679.08 |
| 2018/0247727 A1 | 8/2018 | Ronay | |
| 2019/0155385 A1 | 5/2019 | Lim et al. | |
| 2020/0066628 A1 | 2/2020 | Ronay et al. | |

OTHER PUBLICATIONS

"U.S. Appl. No. 16/833,508, Examiner Interview Summary dated Jun. 11, 2021", 2 pgs.

"U.S. Appl. No. 16/833,508, Final Office Action dated Aug. 23, 2021".

"U.S. Appl. No. 16/833,508, Non Final Office Action dated Mar. 24, 2021", 7 pgs.

"U.S. Appl. No. 16/833,508, Response filed Mar. 15, 2021 to Restriction Requirement dated Jan. 12, 2021", 1 pg.

"U.S. Appl. No. 16/833,508, Response filed Jun. 17, 2021 to Non Final Office Action dated Mar. 24, 2021", 8 pgs.

"U.S. Appl. No. 16/833,508, Response filed Oct. 21, 2021 to Final Office Action dated Aug. 23, 2021", 11 pages.

"U.S. Appl. No. 16/833,508, Restriction Requirement dated Jan. 12, 2021", 6 pgs.

* cited by examiner

DEFORMABLE HUMAN INTERFACE DEVICE

CROSS-REFERENCE TO RELATED APPLICATION

This application claims priority from U.S. Provisional Patent Application Ser. No. 62/824,457 filed Mar. 27, 2019 which is incorporated by reference.

BACKGROUND

Human interface devices are used to control various apparatus by converting user control actions into electric signals that control the apparatus. Handheld human interface devices for control purposes typically include some form of rigid housing with switches, electrical connections, cords, wireless modules, batteries, etc.

SUMMARY

A human interface device may include a deformable body having a handle portion, and a deformable conductor coupled to the deformable body and arranged to deform in response to a physical manipulation of the deformable body. The physical manipulation may include compressing at least a portion of the deformable body. The physical manipulation may include flexing at least a portion of the deformable body. The physical manipulation may include twisting at least a portion of the deformable body. The physical manipulation may include stretching at least a portion of the deformable body. The deformable conductor may be arranged to change an electric characteristic in response to the physical manipulation. The electric characteristic may include a resistance. The electric characteristic may include a capacitance. The electric characteristic may include an inductance. The deformable conductor may include a sensor portion, and a transmission portion. The sensor portion may sense a first type of physical manipulation, and the transmission portion may sense a second type of physical manipulation. The device may further include an interconnect coupled to the deformable conductor. The handle portion may be a first handle portion, the deformable conductor may be a first deformable conductor, and the deformable body may include a second handle portion. The device may further include a second deformable conductor arranged to deform in response to physical manipulation of the deformable body. The first deformable conductor may be on the first handle, and the second deformable conductor may be on the second handle.

A human interface device may include a deformable body, and at least two deformable conductors, each deformable conductor having a sensor portion, wherein the sensor portions of the deformable conductors are arranged in a functional pattern, and wherein the deformable conductors are coupled to the deformable body and arranged to deform in response to a physical manipulation of the deformable body. Each deformable conductor may include a transmission portion. The sensor portions of the deformable conductors may sense a first type of physical manipulation, and at least one of the transmission portions may sense a second type of physical manipulation.

A control method may include holding a deformable body by a handle portion, and deforming at least a portion of the deformable body, wherein deforming at least a portion of the deformable body may cause deformation of a deformable conductor coupled to the deformable body. Deforming at least a portion of the deformable body may include compressing a local portion of the deformable body.

BRIEF DESCRIPTION OF THE DRAWINGS

The figures are not necessarily drawn to scale and elements of similar structures or functions may generally be represented by like reference numerals for illustrative purposes throughout the figures. The figures are only intended to facilitate the description of the various embodiments described herein. The figures do not describe every aspect of the teachings disclosed herein and do not limit the scope of the claims. To prevent the drawing from becoming obscured, not all of the components, connections, and the like may be shown, and not all of the components may have reference numbers. However, patterns of component configurations may be readily apparent from the drawings.

DETAILED DESCRIPTION

Some of the inventive principles of this patent disclosure relate to human interface devices that may have deformable bodies and conductors. These devices may be used in a wide range of applications such as pendants for overhead cranes, robot controllers, computer mice and other human input devices, transmitters for remote controlled aircraft, controllers for inspection cameras, video game controllers, controllers for endoscopes, imaging machines, radiology machines and/or other medical apparatus, etc.

Figure 1:
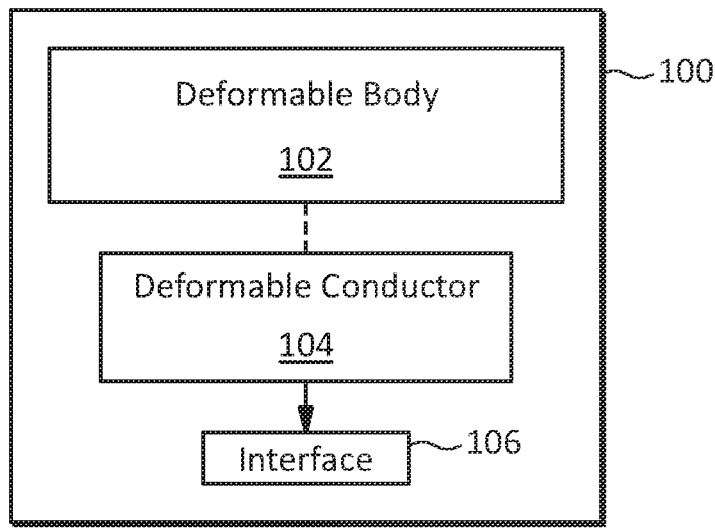
FIG. 1 is a schematic diagram of an embodiment of a human interface device according the principles of this disclosure.

FIG. 1 is a schematic diagram of an embodiment of a human interface device according the principles of this disclosure. The device 100 illustrated in FIG. 1 may include a deformable body 102 and a deformable conductor 104 coupled to the deformable body 102 and arranged to deform in response to a physical manipulation of the deformable body 102. Examples of physical manipulation may include compressing, flexing, twisting, stretching, etc., the deformable body 102. The physical manipulation may be localized to a portion of the deformable body 102 (e.g., a finger press) and/or spread over all or most of the deformable body 102. The deformable conductor may be arranged to change an electric characteristic such as resistance, capacitance, inductance, etc., in response to the physical manipulation. The deformable conductor 104 may be printed on, embedded in, adhered to, or coupled to the deformable body 102 in any other manner, or in any combination thereof.

The deformable conductor 104 may include multiple portions. In some embodiments, the deformable conductor 104 may include a sensor portion and a transmission portion. For example, the sensor portion may be configured as a variable resistor, capacitor, inductor, etc., to sense a finger press at a location on the deformable body 102, whereas the transmission portion may be arranged to couple one or more electric signals from the sensing portion to a connector, processing circuit, and/or other apparatus. By implementing a sensor portion of a deformable conductor as a variable resistor, capacitor, inductor, etc., it may enable the device to provide not only a binary signal, but also a continuous signal based on pressure. For example, a sensor portion may implement a button that may be both tough (contact) sensitive as well as pressure sensitive.

In some embodiments, the transmission portion may also perform a sensing function in addition to a transmission function. For example, a sensing portion may be configured to implement a capacitive sensor to sense a localized finger press on the deformable body 102, whereas, in addition to transmitting a finger press signal from the sensor portion, the transmission portion may also be configured to change resistance in response to a user flexing, twisting, stretching, and/or compressing a larger portion of the deformable body 102. In some embodiments, separate deformable conductors 104 may be included to distinguish localized manipulations from manipulations of the entire or larger portions of the deformable body 102.

The embodiment of FIG. 1 may further include an interface 106 to interface the deformable conductor 104 to other apparatus. For example, the interface 106 may include: one or more interconnects to make an electrical and/or mechanical connection to the deformable conductor 104; one or more connectors to connect the deformable conductor 104 to a wire, cable, cord, etc.; a wireless module to interface the deformable conductor 104 to other apparatus; and/or the like.

Figure 2:
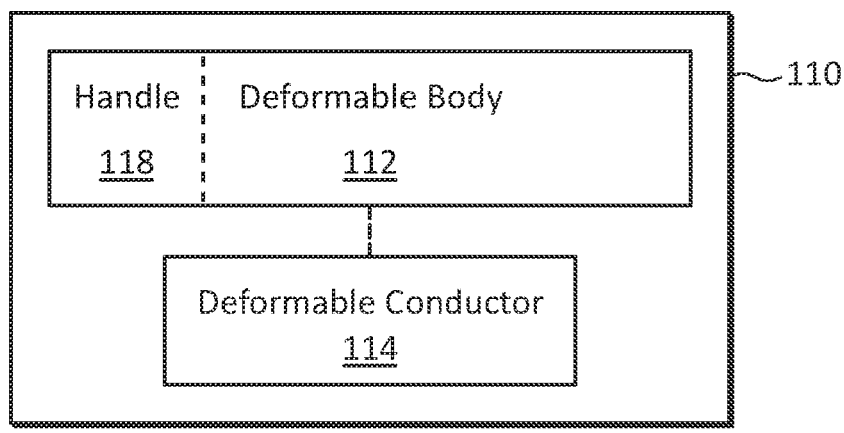
FIG. 2 is a schematic diagram of another embodiment of a human interface device according the principles of this disclosure.

FIG. 2 is a schematic diagram of another embodiment of a human interface device according the principles of this disclosure. The device 110 illustrated in FIG. 2 may include a deformable body 112 and a deformable conductor 114 coupled to the deformable body 112 and arranged to deform in response to a physical manipulation of the deformable body 112 similar to the device 100 of FIG. 1. However, in the device 110 of FIG. 2, the deformable body 112 may include a handle portion 118 that may be configured to enable a user to grip or otherwise hold the deformable body 112 with a hand.

The deformable conductor 114 may be coupled to the deformable body 112 in any configuration. For example, the deformable conductor may be located entirely in and/or on the handle portion 118, partially in and/or on the handle portion 118, entirely in and/or on the remainder of the deformable body 112 but close to the handle portion 118, etc. In some embodiments, for example, the deformable conductor 112 may be located in, on and/or close to (proximate) the handle portion 118 so that the deformable conductor 112 may be manipulated by a user's thumb while the remainder of the user's hand holds the handle portion 118.

Figure 3:
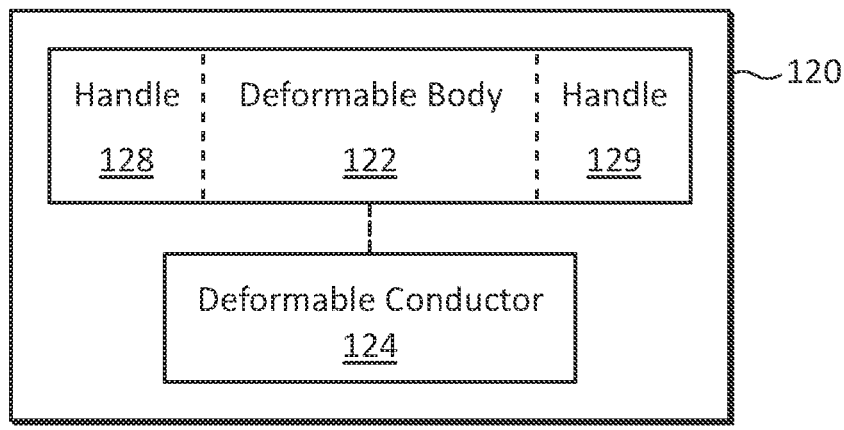
FIG. 3 is a schematic diagram of another embodiment of a human interface device according the principles of this disclosure.

FIG. 3 is a schematic diagram of another embodiment of a human interface device according the principles of this disclosure. The device 120 illustrated in FIG. 2 may include a deformable body 122 and a deformable conductor 124 coupled to the deformable body 122 and arranged to deform in response to a physical manipulation of the deformable body 122 similar to the device 110 of FIG. 2. However, in the device 120 of FIG. 3, the deformable body 122 may include first and second handle portions 128 and 129 that may be configured to enable a user to grip or otherwise hold the deformable body 122 with one or two hands.

Any of the embodiments described above may include any number of additional deformable conductors arranged in any functional pattern in, on, and/or otherwise coupled to, the deformable body. For example, in some embodiments, multiple deformable conductors may have sensor portions arranged to form a keypad such as a numeric or alphanumeric keypad.

As another example, in some embodiments with two handles, a group of sensors may be arranged at or near each handle so a user may manipulate the sensors with finger presses, while one or more additional sensors (and/or transmission portions of the deformable conductors for the two groups of sensors), may be arranged to sense the user flexing, twisting, stretching, and/or compressing a larger portion of the deformable body. Thus, in some embodiments, and depending on the implementation details, a human interface device according to this disclosure may increase the number of simultaneous control actions that may be received from a single user.

Though not shown in the drawings, either of the embodiments illustrated in FIGS. 2 and 3 may include an interface similar to interface 106 illustrated in FIG. 1 to interface the deformable conductors 114 and 124 to other apparatus which may process signals from the deformable conductors and use them for control purposes.

A deformable body may be implemented with any suitable material or combination of materials that may provide deformable characteristics which, in various embodiments, may be characterized as: soft, stretchable, resilient, flexible, compressible, pliable, elastic, and/or the like. In various embodiments, the deformable body, or portions thereof, may or may not spontaneously return to a neutral state when various forces associated with physical manipulation are removed. In various embodiments, a deformable body, or any portion thereof, may have a hardness that would typically be measured on a Shore Hardness Scale of Shore OO or Shore A.

Some examples of materials that may be used for a deformable body include solid and/or foam polymers including neoprene, ethylene propylene diene monomer (EPDM), polyethylene, polyurethane including thermoplastic polyurethane (TPU), natural rubber, nitrile rubber, silicone, etc., fiberglass, metals in flexible forms such as sheet metal, metal foam, etc., as well as other natural materials such as sponges, cork and/or wood, etc., woven and/or nonwoven fabrics, and any hybrid combinations such as laminations or composites thereof.

A deformable body may be implemented in any suitable shape, including relatively flat sheets or pads, as well as more three-dimensional shapes such as rods, tubes, discs, plates, cubes, slabs, as well as more complicated arrangements thereof. Any of the shapes may include curves and/or contouring to accommodate human hands. A deformable body may include multiple deformable portions connected, for example by one or more non-deformable portions.

The controller disclosed herein may be a hand-held device. Alternatively or additionally, it may be designed to interface with other portions of the human body. For example, a pad or piece of furniture designed to be sat on or reclined against may detect and react to differences in pressure from legs, seat, or back caused by leaning or shifting of weight. A controller embedded in a punching back or the like may detect and react to kicking or striking.

In some embodiments, one or more deformable conductors may be implemented with any suitable materials. Although the inventive principles are not limited to any specific compositions for use as deformable conductors, some examples include conductive fluids such as fluid phase gallium-indium-tin alloys, and/or conductive gels including gallium based alloy gels such as gallium-indium-tin alloy gels, some examples of which are disclosed in U.S. Patent Application Publication No. 2018/0247727 published on Aug. 30, 2018 which is incorporated by reference. Other suitable conductors may include any compositions featuring conductive metals including gold, nickel, silver, platinum, copper, etc.; semiconductors based on silicon, gallium, germanium, antimony, arsenic, boron, carbon, selenium, sulfur, tellurium, etc., semiconducting compounds including gallium arsenide, indium antimonide, and oxides of many metals; organic semiconductors; and conductive nonmetallic substances such as graphite.

In some embodiments, the deformable conductor may have at least one fluid property or component, for example, as a fluid phase material or a fluid component of a gel material, among others. In some embodiments, a fluid phase material may be implemented as a pure or essentially pure fluid which may be characterized, for example, in terms of a viscosity. In other embodiments, a fluid phase material may include a solid component, for example, by addition of one or more gelling agents. In such embodiments, the fluid/solid combination may be characterized, for example, in terms of viscoelasticity.

Some example embodiments including some example implementation details are described below. These examples are provided for purposes of illustrating the inventive principles of this disclosure, but the inventive principles are not limited to these example details or applications.

Figure 4:
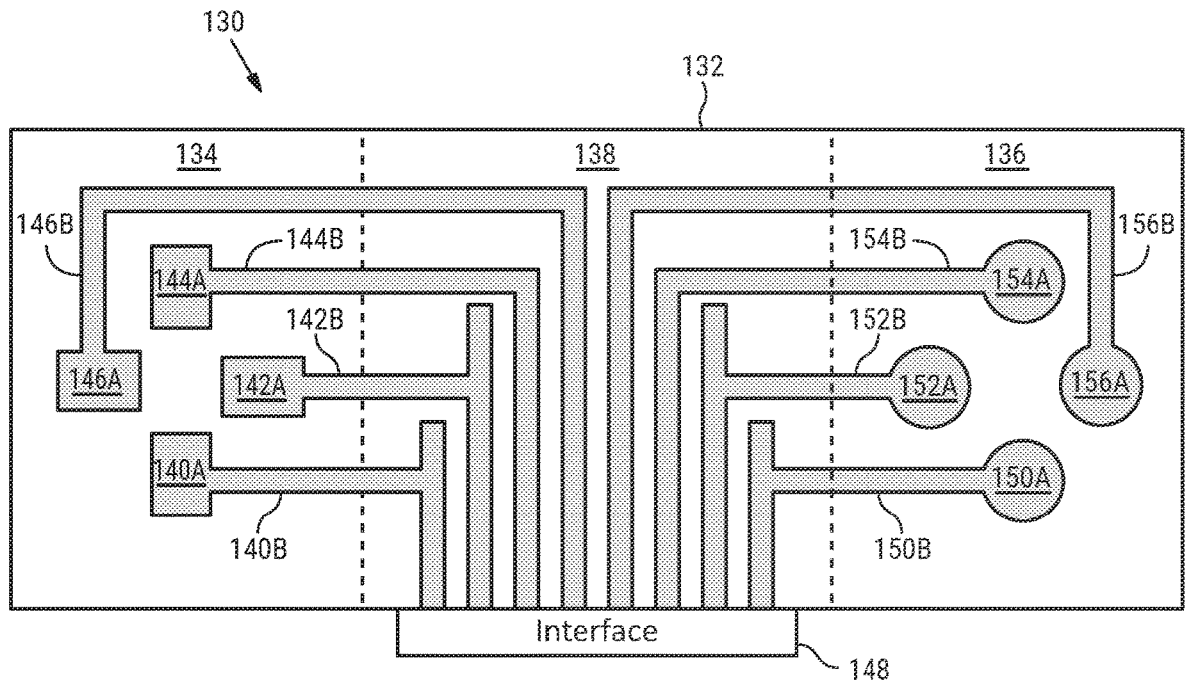
FIG. 4 illustrates an example embodiment of a human interface device according the principles of this disclosure.

FIG. 4 illustrates an example embodiment of a human interface device according the principles of this disclosure. The device 130 illustrated in FIG. 4 may include a deformable body 132 having first and second handle portions 134 and 136, respectively, located at opposite ends of a midsection 138. A first group of deformable conductors 140, 142, 144, and 146 may each have a sensor portion 140A, 142A, 144A, and 146A, respectively, arranged in a functional pattern in and/or on the first handle portion 134. The first group of deformable conductors 140, 142, 144, and 146 may each also have a transmission portion 140B, 142B, 144B, and 146B, respectively, arranged to couple the respective sensor portion to an interface 148. A second group of deformable conductors 150, 152, 154, and 156 may each have a sensor portion 150A, 152A, 154A, and 156A, respectively, arranged in a functional pattern in and/or on the second handle portion 136. The second group of deformable conductors 150, 152, 154, and 156 may each also have a transmission portion 150B, 152B, 154B, and 156B, respectively, arranged to couple the respective sensor portion to the interface 148.

The interface 148 may be implemented with any suitable arrangement of components for interfacing the deformable conductors to one or more control apparatus. In some embodiments, examples may range from simple electric contact locations on the deformable conductors to connectors for wires, cords, and/or cables, to complete signal processing and/or transmission systems including wireless transmission modules. In various embodiments, the interface 148 may be separate from and/or integrated into the deformable body 132.

The layout of the deformable conductors illustrated in FIG. 4 may show the general placement and/or routing of the sensor and/or transmission portions. In some embodiments, a sensor portion may include a more detailed pattern of deformable conductor arranged to form a resistive, capacitive, inductive, and/or other type of sensor. In some embodiments, a transmission portion may include two traces of deformable conductor arranged to provide supply and return conductive paths. In some embodiments, a transmission portion may include a single trace of deformable conductor to provide a supply path with a return path provided, for example, through a common return and/or ground connection.

In some embodiments, the deformable body 132 may be fabricated, for example, from a monolithic or laminated sheet of comfortable material such as memory foam, lipofoam and/or any other polyurethane or other polymer based foam having an open and/or closed cell structure. In some embodiments, the deformable body 132 may function as a main texture and/or tactile forming layer, allowing for the device to feel pliable, soft and/or comfortable.

In some embodiments, some or all of the deformable conductors may be implemented with gallium based fluids and/or gels as mentioned above. The deformable conductors may be formed on a surface of the deformable body through any suitable deposition process such as contact printing, jet printing, stenciling, etc. The deformable conductors may be encapsulated using any suitable materials such as silicones or polydimethylsiloxane (PDMS), urethanes including TPU, epoxies, polyesters, polyamides, varnishes, and any other material that may provide a protective coating and/or help hold the deformable conductor in place. In some embodiments, the encapsulant or encapsulants may be selected to provide a stretchable characteristic.

In some embodiments, some or all of the deformable conductors may be embedded in the deformable body 132 using any suitable technique. For example, a deformable conductor may be embedded in the deformable body 132 by building up the body through a stenciling technique such as those disclosed in U.S. Patent Application Publication No. 2020/0066628 published on Feb. 27, 2020 which is incorporated by reference. Techniques from that application may also be used, for example, to provide connections to one or more of the deformable conductors.

In some embodiments, the transmission portions of the deformable conductors may function only to couple one or more electric signals from the sensing portions to the interface 148. In other embodiments, one or more of the transmission portions may perform a sensing function in addition to a transmission function. For example, any of the transmission portions 140B, 142B, 144B, and 146B and 150B, 152B, 154B, and 156B may be configured to change resistance in response to a user flexing, twisting, stretching, and/or compressing any or all of the handles 134 and 136 and/or the midsection 138.

In some embodiments, the arrangement of transmission portions illustrated in FIG. 4 may function as a two-dimensional array of resistive sensing elements that may enable the transmission portions to sense a strain field within the deformable body, for example by outputting a vector of signals to the interface 148 as described in the above-mentioned U.S. Patent Application Publication No. 2018/0247727. In some embodiments, resistive, capacitive, inductive, and/or impedance sensors may be implemented as also described in the above-mentioned U.S. Patent Application Publication No. 2018/0247727.

In some embodiments, a deformable body 132 may include additional deformable conductors configured as separate dedicated sensors to detect flexing, twisting, stretching, and/or compression of any portion of the deformable body 132.

In some embodiments, one or more electromagnetic interference (EMI) shielding layers may be included, for example, to prevent stray electric and/or magnetic fields from outside the device from inducing unwanted signals or noise in the deformable conductors. Thus, one or more EMI shielding layers may help reduce or eliminate signals from sources except those caused by the user's manipulation of the sensor and/or transmission portions of the deformable conductors. In some embodiments, one or more EMI shielding layers may also function as one or more ground planes.

Examples of materials that may be used for EMI shielding include conductive foams such as metal plated polymer foams (e.g., nickel-copper or silver plated polyurethane foam), conductive fabrics such as metal plated polymer fabrics (e.g., nickel-copper or silver plated nylon or polyester woven or nonwoven fabrics) and/or fabric-over-foam combinations thereof.

One or more EMI shielding layers may be attached to the back side (i.e., facing into the plane of the drawing) and/or front side (i.e., facing out from the plane of the drawing) of the deformable body 132 in any suitable manner including bonding with adhesives, thermal and/or ultrasonic welding, etc. In some embodiments, an EMI shielding layer on the front of the deformable body 132 may include windows or openings to enable a user to access the sensor portions of the deformable conductors. In other embodiments, an EMI shielding layer may be thin and/or soft enough that it does not interfere with the sensing of finger presses on the sensor portions of the deformable conductors.

Figure 5:
FIG. 5 illustrates an example embodiment of a cover layer according to this disclosure.

FIG. 5 illustrates an example embodiment of a cover layer that may be used in conjunction with the human interface device 130 according to this disclosure. In some embodiments, the cover layer 159 may have the same general size and shape as the deformable body 132. It may include a first set of openings 160A, 162A, 164A and 166A which may align with the first set of sensor portions 140A, 142A, 144A, and 146A, respectively, and a second set of openings 170A, 172A, 174A and 176A which may align with the second set of sensor portions 150A, 152A, 154A and 156A.

The cover layer 159 may be fabricated from any of the materials that may be used for the deformable body 132, and/or the EMI shielding layers as disclosed above, and/or any other suitable materials. The cover layer 159 may function, for example, to protect any of the transmission portions of the deformable conductors, to provide additional texture and/or tactile feel to the device, to provide EMI shielding and/or a ground plane if it includes a conductive material, and/or any other function. The cover layer 159 may be attached to the front side of the deformable body 132 in any suitable manner including bonding with adhesives, thermal and/or ultrasonic welding, etc.

In some other embodiments, the cover layer 159 may be larger or smaller than the deformable body 132. For example, it may cover only an area around the sensor portions and transmission portions of the deformable conductors.

In some embodiments, one or more of the deformable conductors may be encapsulated by entrapping the deformable conductor between the deformable body 132 and the cover layer 159, which may be bonded together. For example, in some embodiments, a first bonding layer of semi-cured adhesive may be attached through, for example, silk screening onto the deformable body 132. A fluid phase conductor such as a eutectic or other alloy of Gallium, for example, Gallium-Indium-Tin, may be formed into patterns onto the semi-cured adhesive to form the deformable conductors. The cover layer 159 may be prepared with another bonding layer of semi-cured adhesive on the back side. The two bonding layers may then be brought into contact with each other, thereby bonding the deformable body 132 and cover layer 159 with the deformable conductors entrapped between the two layers of adhesive. The adhesive layers may be cured chemically and/or thermally and/or with any other suitable curing process, with or without application of pressure to the assembly.

In some embodiments, only one bonding layer may be used. In other embodiments, both of the bonding layers may be omitted and the deformable body 132 and cover layer 159 may be bonded directly through any other suitable technique such as thermal or ultrasonic welding, with the deformable conductors entrapped therebetween. Any of these embodiments may result in the deformable conductors being entrapped in a manner that may be protected against environmental factors and/or other potential sources of damage to the deformable conductors.

In some embodiments, one or more of the deformable conductors may be implemented with a viscoelastic material having both a fluid and a solid component which may be characterized as having viscoelastic properties, for example a viscoelastic gel. By selecting such a deformable conductor to have a higher storage modulus (G') than the one or more bonding layers and/or deformable body 132 and/or cover layer 159, the deformable conductors may survive some degree of compression during a bonding step.

Figure 6:
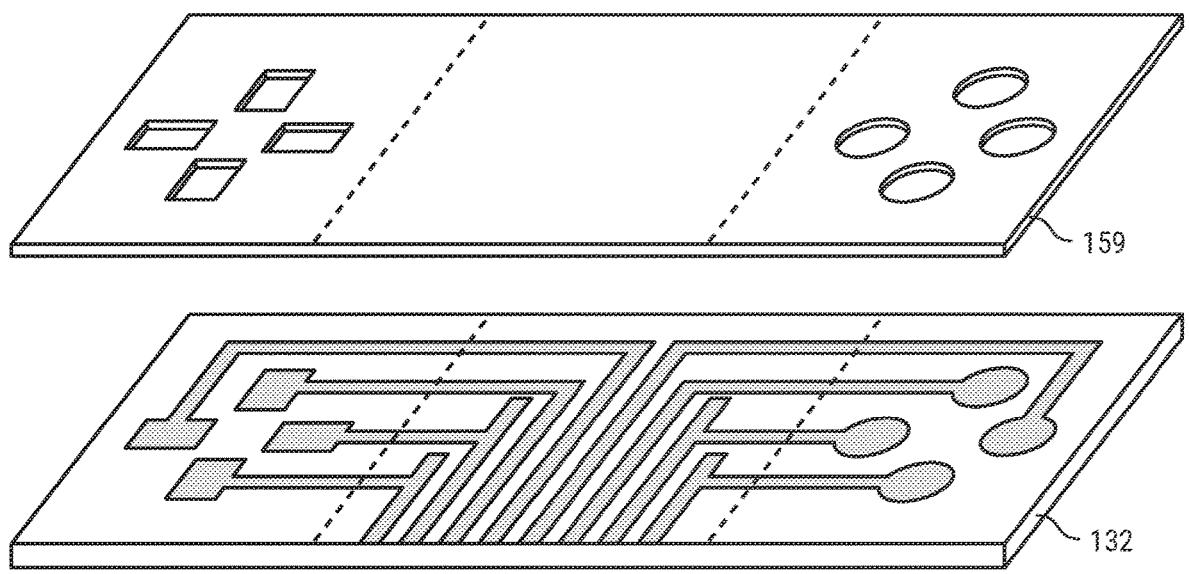
FIG. 6 is a perspective view showing the deformable body of FIG. 4 and the cover layer of FIG. 5 prior to assembly.
Figure 7:
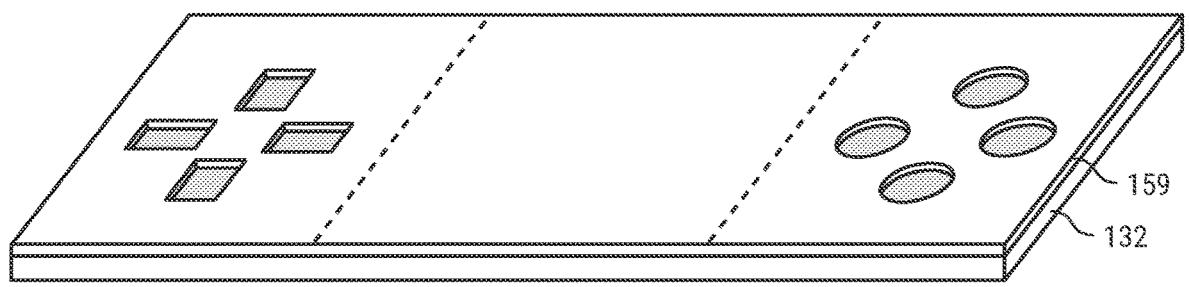
FIG. 7 is a perspective view showing the cover layer of FIG. 5 attached to the deformable body of FIG. 4.

FIG. 6 is a perspective view showing the deformable body 132 and cover layer 159 prior to assembly. FIG. 7 is a perspective view showing the cover layer 159 attached to the deformable body 132.

Figure 8:
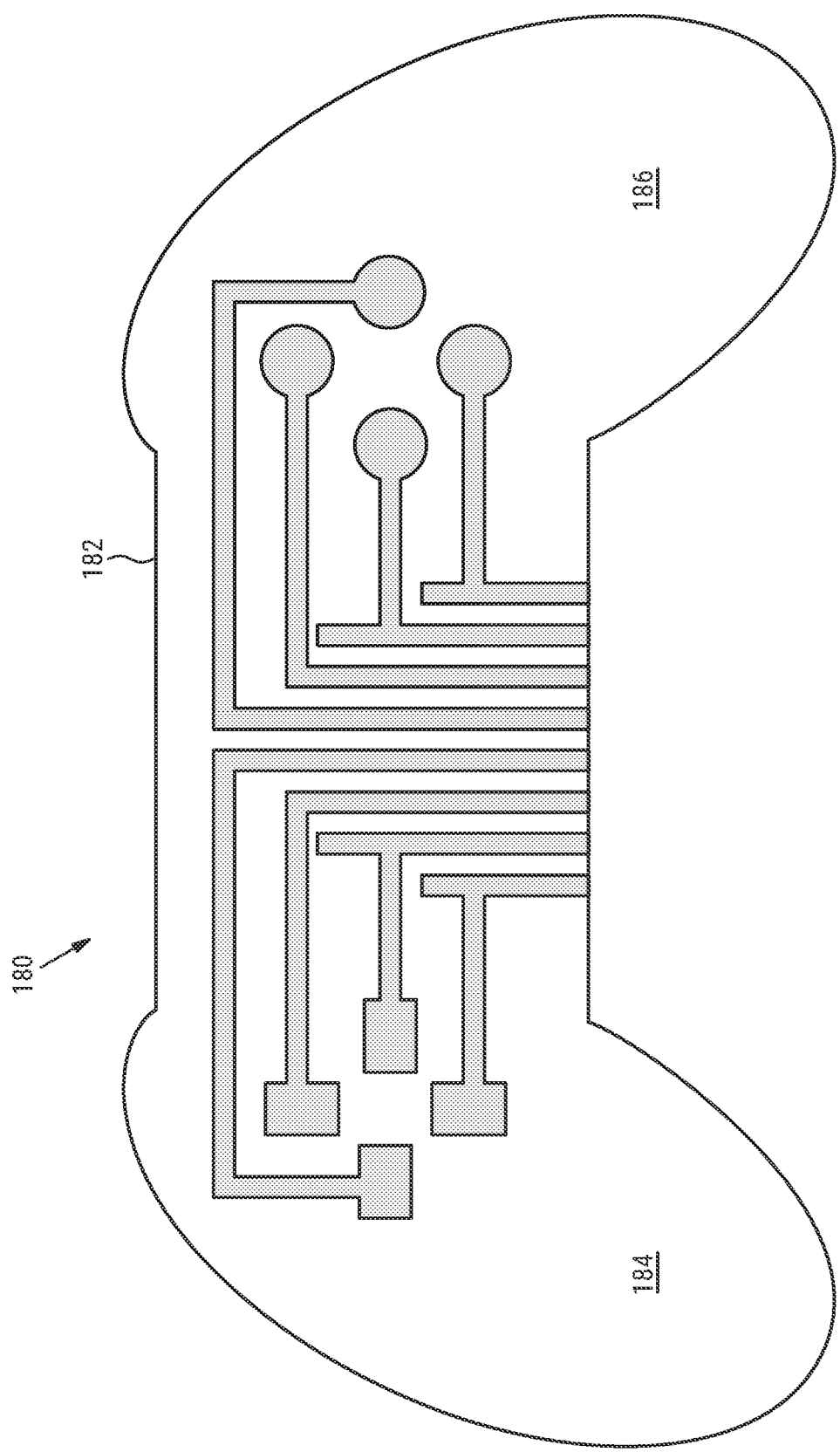
FIG. 8 illustrates another example embodiment of a human interface device according the principles of this disclosure.

FIG. 8 illustrates another example embodiment of a human interface device according the principles of this disclosure. The device 180 illustrated in FIG. 6 may have a similar structure and/or function as the embodiment of FIG. 4, but with the device 180 of FIG. 6, the deformable body 182 may include handles 184 and 186 that may have elliptical or lobed shapes. These shapes may provide, for example, enhanced gripping or holding performance.

Figure 9:
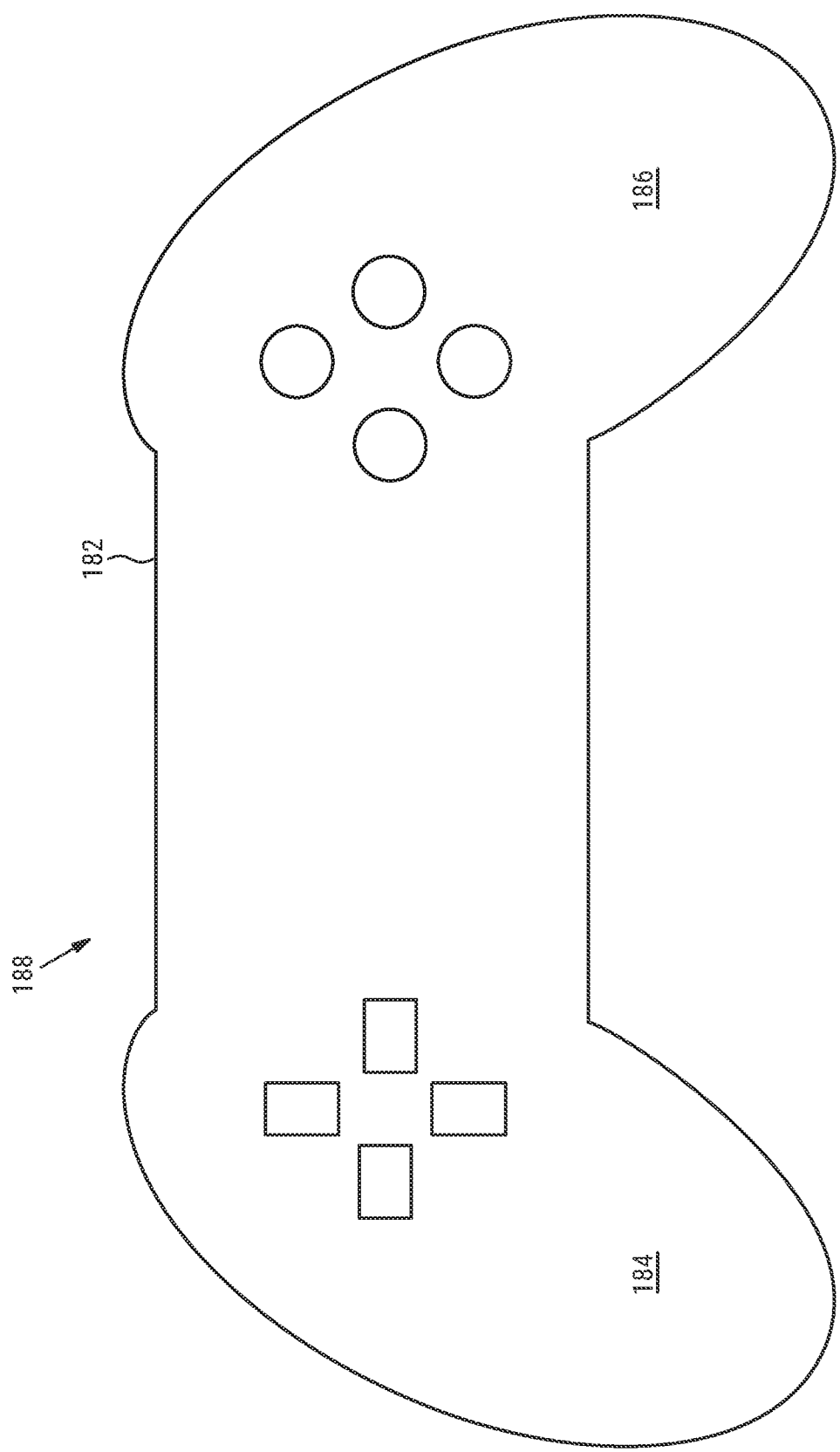
FIG. 9 illustrates another example embodiment of a cover layer according to this disclosure.
Figure 10:
FIGS. 10-14 illustrate example embodiments of capacitive sensors according to this disclosure.
Figure 11:
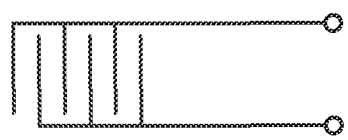
Figure 12:
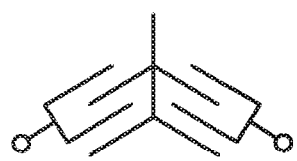
Figure 13:
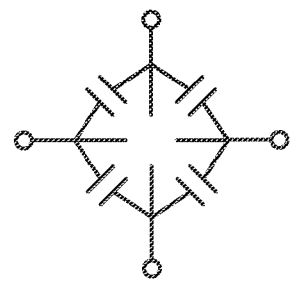
Figure 14:
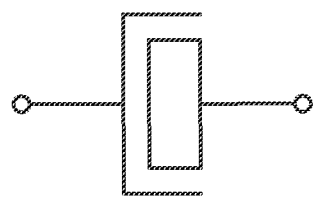
Figure 15:
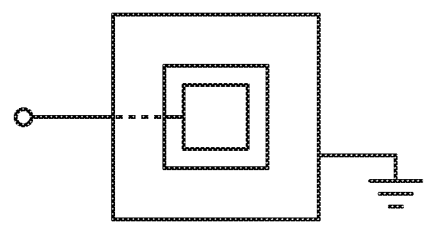
FIGS. 15-18 illustrate additional example embodiments of capacitive sensors according to this disclosure.
Figure 16:
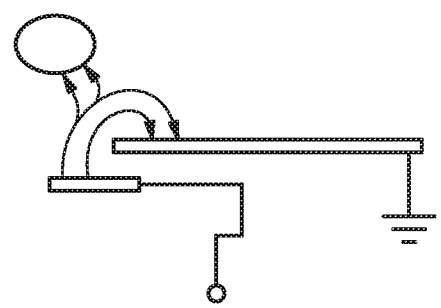
Figure 17:
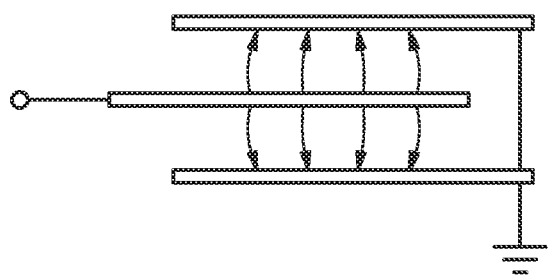
Figure 18:
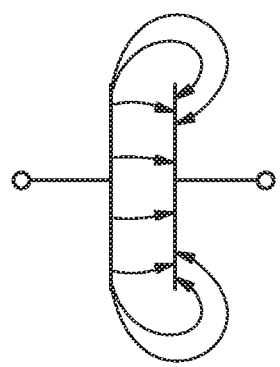

FIG. 9 illustrates an example embodiment of a cover layer that may be used in conjunction with the human interface device 180 according to this disclosure. In some embodiments, the cover layer 188 may be made from similar materials, perform similar functions, and/or be attached to the deformable body 182 in similar manners to the cover layer 159 of FIG. 5.

Conventional controllers typically have housing fabricated from rigid molded plastics. These controllers and similar human interface devices such as joysticks, keyboards, computer mice, etc., tend to be heavy and/or uncomfortable, especially after long periods of use, and may be outfitted with a variety of sensors and buttons that may only provide binary (i.e., "on" or "off") signals. Moreover conventional hard controllers may cause injuries to users and/or bystanders and/or damage to the delicate and/or brittle controller itself and/or other property. This may be true in any application, such as by an enthusiastic or distracted video game player, but also especially in more critical applications such as industrial applications like industrial equipment controllers (e.g., cranes) and/or medical applications.

In contrast, some embodiments of human interface devices according to the principles of this disclosure may be safer, and/or more durable, and/or comfortable to use during both short and/or long term use. Furthermore, a deformable controller may be integrated into other apparatus such as fabric or other cladding in a vehicle interior, upholstery in furniture such as an easy chair, etc. which may be controlled by a deformable controller according to this disclosure. Moreover, some embodiments according to the principles of this disclosure may provide for relatively inexpensive and/or easy replacement of an inoperable device. For example, moving signal processing and/or other electronics from the deformable body to external sensing and/or control circuitry may reduce the cost of replacing a human interface device which may be relatively inexpensive to manufacture with only the deformable body and conductors and a simple connector to interface the device to a hard wired cable or cord.

FIGS. 10-14 illustrate example embodiments of two-dimensional traces that may be used to implement capacitive sensors according to this disclosure.

FIGS. 15-18 illustrate additional example embodiments of capacitive sensors according to this disclosure including interactions with ground planes, lines of electrostatic force and interactions with solid objects such as a users finger.

Since the inventive principles of this patent disclosure can be modified in arrangement and detail without departing from the inventive concepts, such changes and modifications are considered to fall within the scope of the following claims.

The invention claimed is:

1. An interface device, comprising:
   a deformable housing configured to be physically manipulated consistent with a first user input; and
   an electronic trace comprising conductive gel extending along the deformable housing, the electronic trace configured to transmit a current from a first end of the electronic trace to a second end of the electronic trace;
   wherein a portion of the electronic trace is configured to receive a first physical manipulation from a user, the first physical manipulation causing a change in current along the electronic trace which is configured to be interpreted as a first control action, the first electronic input being a binary control action;
   wherein the electronic trace is further configured to sense a strain field within the deformable housing from a second physical manipulation by the user and interpret the strain field as a second control action different than the first control action, the second electronic input being a variable control action.

2. The interface device of claim 1, wherein the second physical manipulation comprises one or more of flexing, twisting, stretching, or compressing at least a portion of the deformable housing.

3. The interface device of claim 2, wherein a degree of the second physical manipulation produces the variable control action.

4. The interface device of claim 1, wherein the change in current is caused by a change in resistance of the electronic trace.

5. The interface device of claim 4, further comprising a button, operatively coupled to the electronic trace, and configured to receive the first physical manipulation and cause the change in resistance in the electronic trace.

6. The interface device of claim 4, wherein the change in current is caused by opening a circuit including the electronic trace.

7. The interface device of claim 1, wherein the deformable housing is comprised of at least one of a solid polymer, a foam polymer, a fiberglass metal, or natural materials.

8. The interface device of claim 1, wherein the electronic trace comprises:
   a sensor portion configured to detect the strain field; and
   a transmission portion.

9. The interface device of claim 8, further comprising an interconnect operatively coupled to the transmission portion of the electronic trace, the interconnect configured to output the first control action and the second control action.

10. The interface device of claim 1, wherein the electronic trace has a length at least ten times greater than a width or thickness of the electronic trace.

11. The interface device of claim 10, wherein the electronic trace forms a corner of approximately ninety degrees.

12. A method, comprising:
   obtaining a deformable housing configured to be physically manipulated consistent with a first user input; and
   applying an electronic trace comprising conductive gel to the deformable housing, the electronic trace extending along the deformable housing, the electronic trace configured to transmit a current from a first end of the electronic trace to a second end of the electronic trace;
   wherein a portion of the electronic trace is configured to receive a first physical manipulation from a user, the first physical manipulation causing a change in current along the electronic trace which is configured to be interpreted as a first control action, the first electronic input being a binary control action;
   wherein the electronic trace is further configured to sense a strain field within the deformable housing from a second physical manipulation by the user and interpret the strain field as a second control action different than the first control action, the second electronic input being a variable control action.

13. The method of claim 12, wherein the second physical manipulation comprises one or more of flexing, twisting, stretching, or compressing at least a portion of the deformable housing.

14. The method of claim 13, wherein a degree of the second physical manipulation produces the variable control action.

15. The method of claim 12, wherein the change in current is caused by a change in resistance of the electronic trace.

16. The method of claim 15, further comprising operatively coupling a button to the electronic trace, the button configured to receive the first physical manipulation and cause the change in resistance in the electronic trace.

17. The method of claim 15, wherein the change in current is caused by opening a circuit including the electronic trace.

18. The method claim 12, wherein the deformable housing is comprised of at least one of a solid polymer, a foam polymer, a fiberglass metal, or natural materials.

19. The method of claim 12, wherein applying the electronic trace comprises forming:
   a sensor portion configured to detect the strain field; and
   a transmission portion.

20. The method of claim 12, wherein applying the electronic trace includes forming the electronic trace with a length at least ten times greater than a width or thickness of the electronic trace.

* * * * *